US011373942B2

(12) United States Patent
Ko et al.

(10) Patent No.: US 11,373,942 B2
(45) Date of Patent: Jun. 28, 2022

(54) SEMICONDUCTOR DEVICES

(71) Applicant: Samsung Electronics Co., Ltd., Suwon-si (KR)

(72) Inventors: Junyoung Ko, Cheonan-si (KR); Senyun Kim, Cheonan-si (KR); Younghoon Ro, Cheonan-si (KR)

(73) Assignee: SAMSUNG ELECTRONICS CO., LTD.

( * ) Notice: Subject to any disclaimer, the term of this patent is extended or adjusted under 35 U.S.C. 154(b) by 102 days.

(21) Appl. No.: 16/826,995

(22) Filed: Mar. 23, 2020

(65) Prior Publication Data

US 2021/0050291 A1 Feb. 18, 2021

(30) Foreign Application Priority Data

Aug. 14, 2019 (KR) .......................... 10-2019-0099316

(51) Int. Cl.
*H01L 23/498* (2006.01)
*H01L 23/14* (2006.01)
*H01L 23/31* (2006.01)
*H01L 23/00* (2006.01)
*H01L 21/48* (2006.01)

(52) U.S. Cl.
CPC .... *H01L 23/49838* (2013.01); *H01L 21/4846* (2013.01); *H01L 23/145* (2013.01); *H01L 23/3185* (2013.01); *H01L 23/4985* (2013.01); *H01L 23/49811* (2013.01); *H01L 23/49894* (2013.01); *H01L 24/16* (2013.01); *H01L 2224/16238* (2013.01)

(58) Field of Classification Search
CPC ............. H01L 23/49838; H01L 23/145; H01L 23/3185; H01L 23/49811; H01L 23/4985; H01L 23/49894; H01L 24/16; H01L 2224/16238
See application file for complete search history.

(56) References Cited

U.S. PATENT DOCUMENTS

| 7,061,078 | B2 | 6/2006 | Cheng |
| 8,269,322 | B2 | 9/2012 | Kim |
| 9,305,890 | B2 | 4/2016 | Lii et al. |
| 9,418,913 | B2 | 8/2016 | Shim et al. |
| 9,418,928 | B2 | 8/2016 | Liang et al. |

(Continued)

FOREIGN PATENT DOCUMENTS

JP       2006229018       8/2006

*Primary Examiner* — Peniel M Gumedzoe
(74) *Attorney, Agent, or Firm* — Myers Bigel, P.A.

(57) ABSTRACT

A semiconductor device comprises a substrate, a semiconductor chip on the substrate, and first and second leads between the substrate and the semiconductor chip. The first and second leads extend from an edge of the substrate toward below the semiconductor chip along a first direction parallel to a top surface of the substrate. The first lead includes a first bump connector and a first segment. The second lead includes a second bump connector. The first bump connector is spaced apart in the first direction from the second bump connector. The first segment of the first lead is spaced apart in a second direction from the second bump connector. The second direction is parallel to the top surface of the substrate and perpendicular to the first direction. A thickness of the first segment of the first lead is less than that of the second bump connector.

19 Claims, 12 Drawing Sheets

(56) References Cited

U.S. PATENT DOCUMENTS

| | | |
|---:|---|---|
| 9,748,193 B2 | 8/2017 | Kim et al. |
| 2005/0133912 A1 | 6/2005 | Wu et al. |
| 2006/0091504 A1 | 5/2006 | Kang et al. |
| 2009/0020316 A1 | 1/2009 | Wu et al. |
| 2009/0065934 A1 | 3/2009 | Chung et al. |
| 2010/0071950 A1* | 3/2010 | Ohsumi ............ H01L 23/49838 |
| | | 174/261 |

* cited by examiner

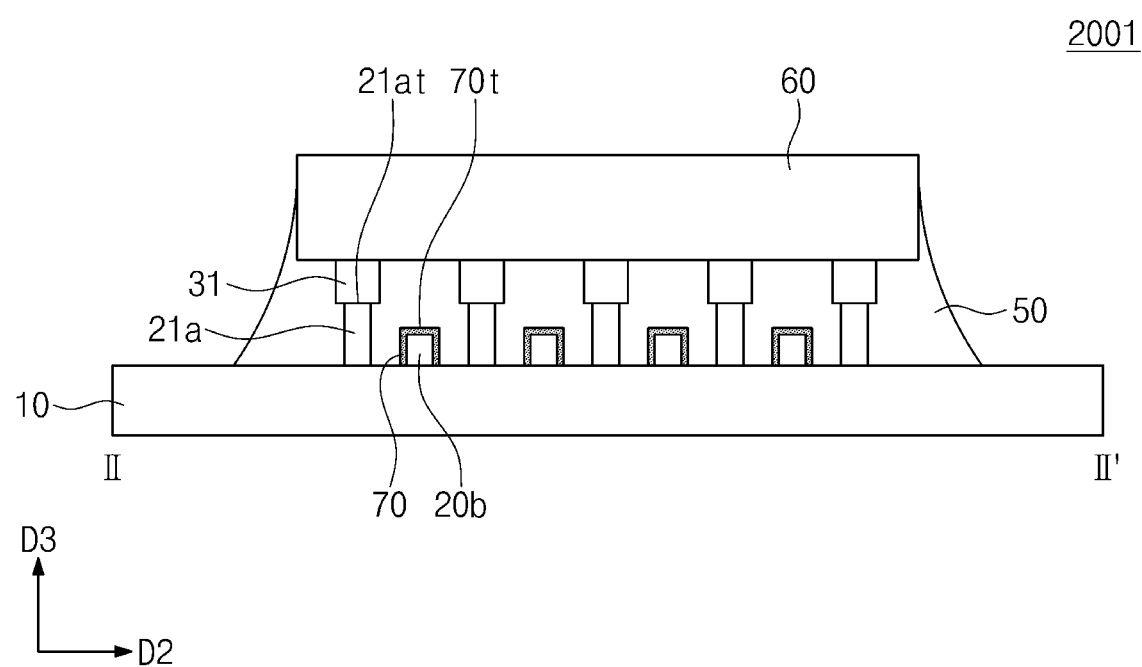

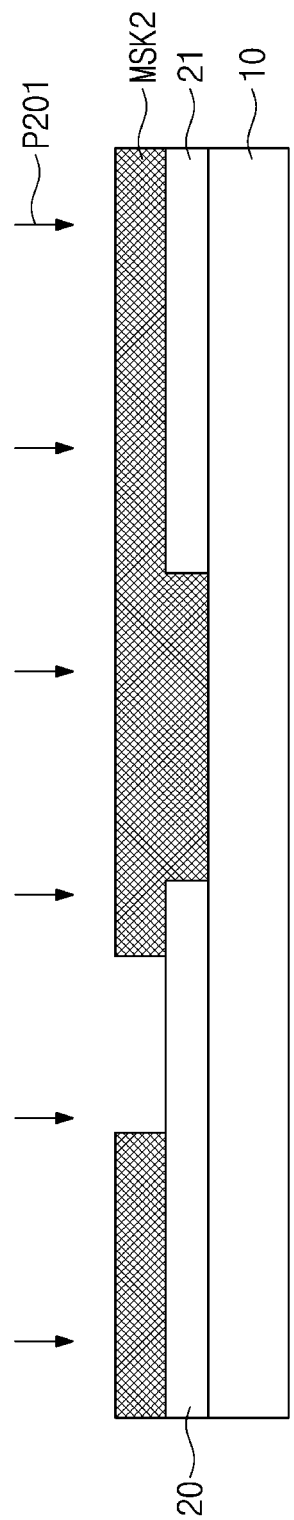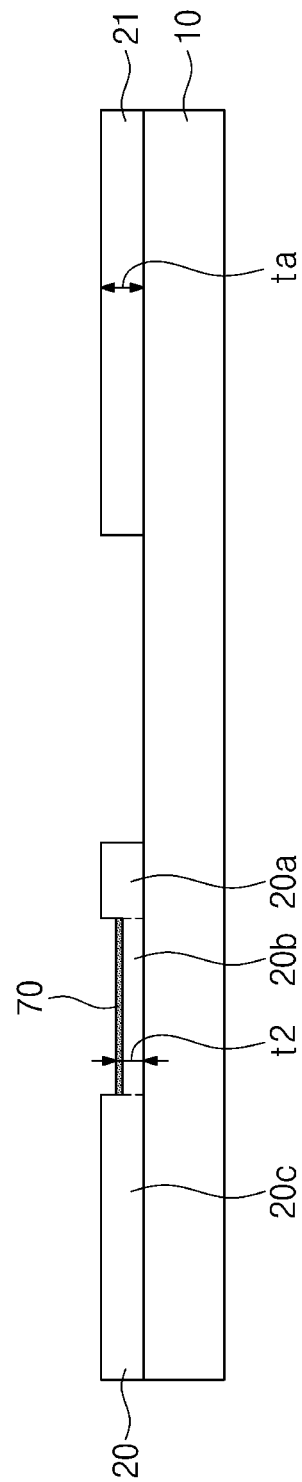

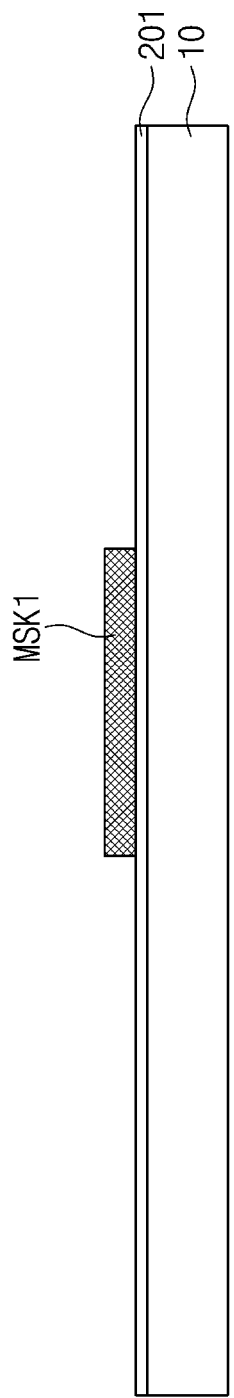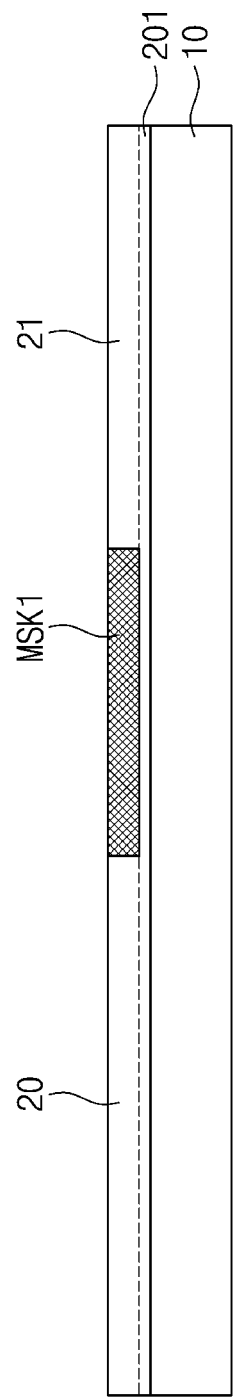

SEMICONDUCTOR DEVICES

CROSS-REFERENCE TO RELATED APPLICATION

This U.S. nonprovisional application claims priority under 35 U.S.C § 119 to Korean Patent Application No. 10-2019-0099316 filed on Aug. 14, 2019, in the Korean Intellectual Property Office, the entire contents of which are hereby incorporated by reference.

BACKGROUND

The present inventive concepts relate to semiconductor devices, and more particularly, to semiconductor devices including fine-pitch leads.

Due to the development of electronic technology, semiconductor devices have rapidly been down-scaled in recent years. The demands on functionality of electronic devices increase the number of leads of an integrated circuit (IC) in electronic devices. To manufacture more leads in a confined area, studies have been conducted to narrow intervals between adjacent leads.

SUMMARY

Some example embodiments of the present inventive concepts provide a fine lead structure that prevents and/or reduces current leakage between adjacent leads.

An object of the present inventive concepts is not limited to the embodiments mentioned above, and other objects which have not been mentioned above will be clearly understood to those skilled in the art from the following description.

According to some example embodiments of the present inventive concepts, a semiconductor device may comprise: a substrate; a semiconductor chip on the substrate; and a first lead and a second lead between the substrate and the semiconductor chip. The first lead and the second lead may extend on the substrate to below the semiconductor chip along a first direction parallel to a top surface of the substrate. The first lead may include a first bump connector and a first segment connected to the first bump connector. The second lead may include a second bump connector. The first bump connector may be spaced apart in the first direction from the second bump connector. The first segment of the first lead may be spaced apart in a second direction from the second bump connector. The second direction may be parallel to the top surface of the substrate and perpendicular to the first direction. A thickness of the first segment of the first lead may be less than a thickness of the second bump connector.

According to some example embodiments of the present inventive concepts, a semiconductor device may comprise: a substrate; a semiconductor chip on the substrate; a plurality of first leads between the semiconductor chip and the substrate; and a plurality of second leads between ones of the plurality of first leads. The first leads and the second leads may extend on the substrate to below the semiconductor chip along a first direction parallel to a top surface of the substrate. The first leads may extend in the first direction farther than the second leads. Each of the first leads may include a first bump connector and each of the second leads may include a second bump connector and a plurality of second bump connectors. The first bump connectors and the second bump connectors may be arranged in a zigzag fashion along a second direction that is parallel to the top surface of the substrate and is perpendicular to the first direction. Each of the first leads may include a first segment between adjacent second bump connectors. A top surface of the first segment of each of the first leads may be at a level lower than a level of a top surface of each of the second bump connectors.

According to some example embodiments of the present inventive concepts, a semiconductor device may comprise: a substrate; a semiconductor chip on the substrate; a first lead and a second lead between the substrate and the semiconductor chip; a solder mask that is on portions of the first lead and the second lead; and an under-fill layer on portions of the substrate, the first leads, the second leads, and the solder mask. The first lead and the second lead may extend on the substrate to below the semiconductor chip along a first direction parallel to a top surface of the substrate. The first lead may extend in the first direction farther than the second lead. The first lead and the second lead may be spaced apart from each other in a second direction that is parallel to the top surface of the substrate and is perpendicular to the first direction. The first lead may include a first bump connector, a first segment, and a second segment, the first segment being between the second segment and the first bump connector. The second lead may include a second bump connector. A dielectric pattern may be on the first segment of the first lead. The first bump connector may be spaced apart in the first direction from the second bump connector. The first segment of the first lead may be spaced apart in the second direction from the second bump connector. A first end of the first segment of the first lead may vertically overlap the semiconductor chip, and a second end of the first segment of the first lead may vertically overlap the solder mask. A thickness of the first segment of the first lead may be less than a thickness of the second bump connector, a thickness of the first bump connector, and a thickness of the second segment of the first lead.

BRIEF DESCRIPTION OF THE DRAWINGS

FIGS. 3A and 3B illustrate cross-sectional views, respectively taken along lines I-I' and II-II' of FIG. 2A, of a semiconductor device according to some example embodiments of the present inventive concepts.

FIGS. 4A to 4D illustrate cross-sectional views of a method of fabricating a semiconductor device according to some example embodiments of the present inventive concepts.

FIGS. 5A to 5D illustrate cross-sectional views of a method of fabricating a semiconductor device according to some example embodiments of the present inventive concepts.

DETAILED DESCRIPTION

The following will now describe semiconductor devices according to the present inventive concepts with reference to accompanying drawings.

Figure 1A:
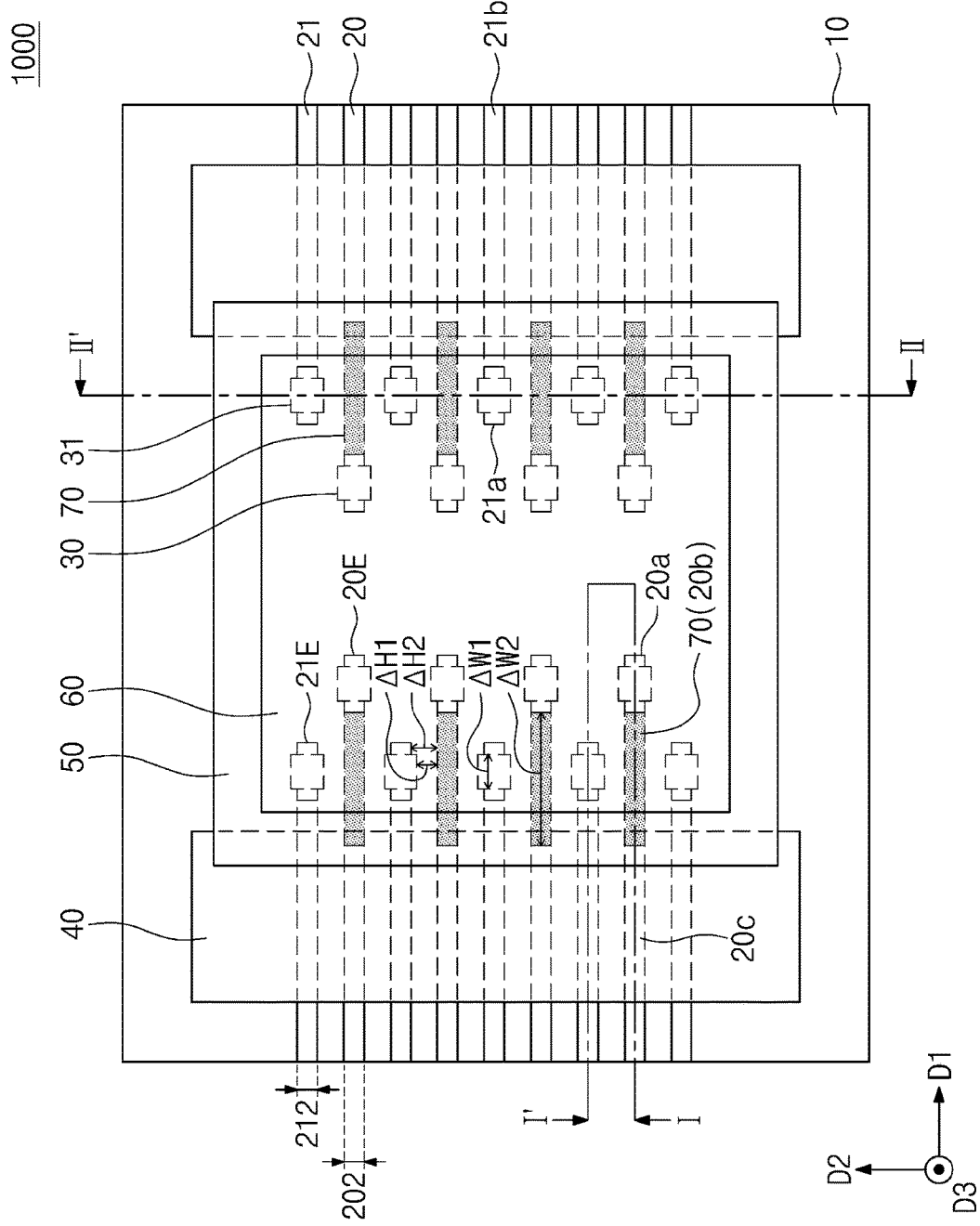
FIG. 1A illustrates a plan view of a semiconductor device according to some example embodiments of the present inventive concepts.
Figure 1B:
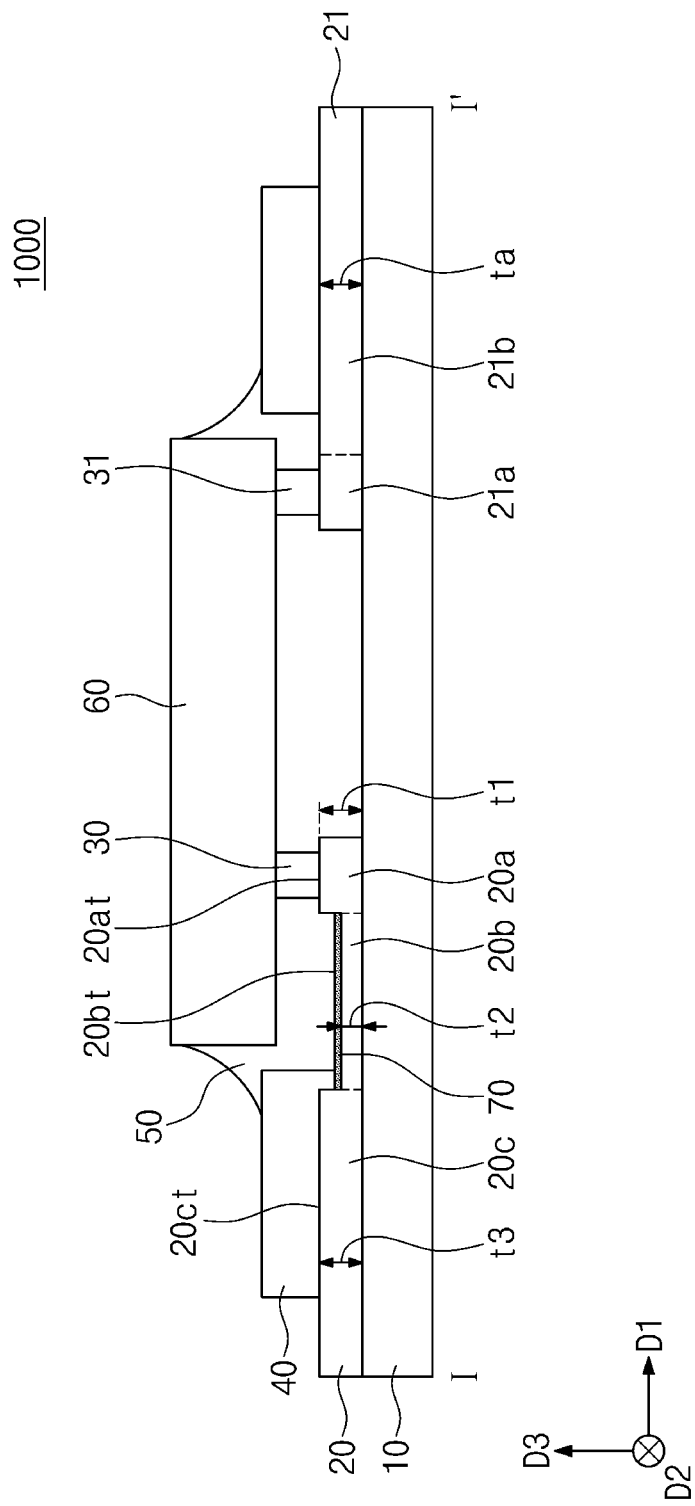
FIG. 1B illustrates a cross-sectional view taken along line I-I' of FIG. 1A.
Figure 1C:
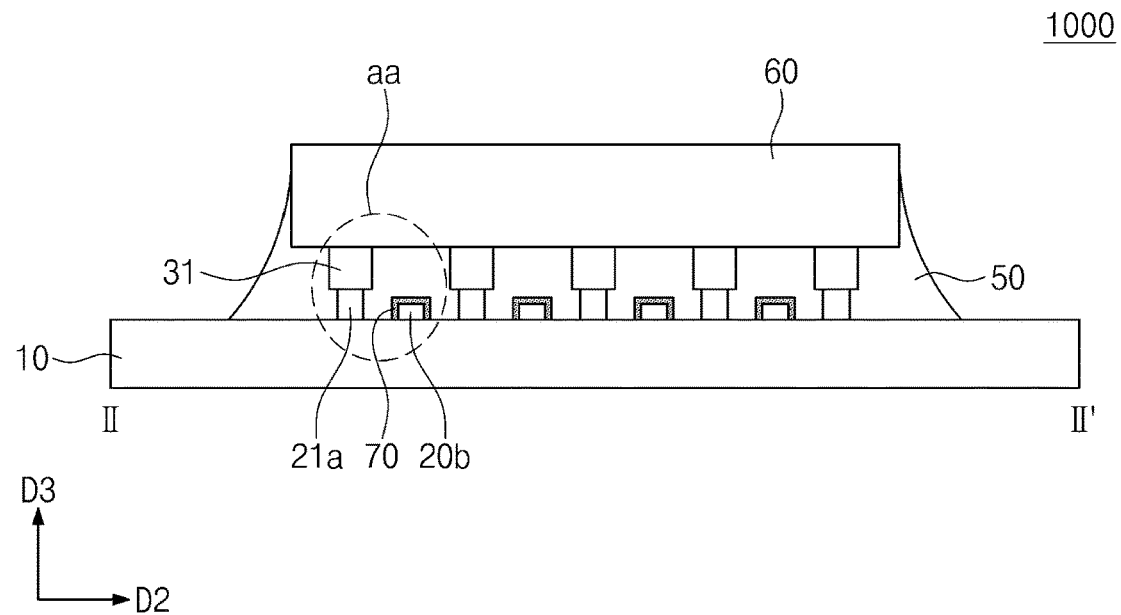
FIG. 1C illustrates a cross-sectional view taken along line II-II' of FIG. 1A.
Figure 1D:
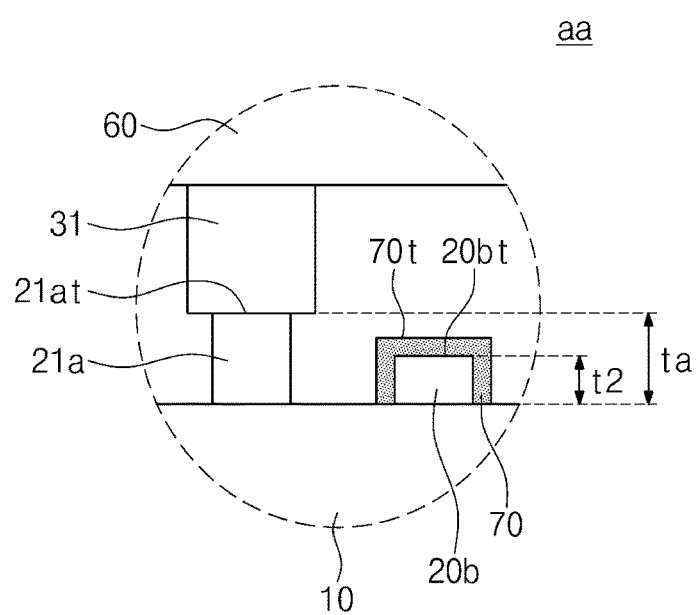
FIG. 1D illustrates an enlarged view showing section 'aa' of FIG. 1C.

FIG. 1A illustrates a plan view of a semiconductor device according to some example embodiments of the present inventive concepts. FIG. 1B illustrates a cross-sectional view taken along line I-I' of FIG. 1A. FIG. 1C illustrates a cross-sectional view taken along line II-II' of FIG. 1A. FIG. 1D illustrates an enlarged view showing section 'aa' of FIG. 1C.

Referring to FIGS. 1A to 1D, a semiconductor device 1000 according to some embodiments of the present inventive concepts may include a substrate 10, a plurality of first leads 20, a plurality of second leads 21, a plurality of solder masks 40, an under-fill layer 50, and a semiconductor chip 60.

The substrate 10 may include, for example, a printed circuit board (PCB) or a flexible film, though the present inventive concepts are not limited thereto. The flexible film may include, for example, polyimide.

The plurality of solder masks 40 may cover portions of the first leads 20 and portions of the second leads 21. The plurality of solder masks 40 may prevent and/or reduce an occurrence in the first and second leads 20 and 21 of oxidation and/or shorts during heat treatment when the semiconductor chip 60 is mounted on the substrate 10.

A plurality of bumps 30 and 31 may be provided on pads (not shown) disposed on a lower portion of the semiconductor chip 60. The plurality of bumps 30 and 31 may include, for example, gold (Au). The plurality of bumps 30 and 31 may include first bumps 30 and second bumps 31. The first bumps 30 and the second bumps 31 may be arranged in a zigzag fashion when viewed in plan. In some embodiments, the first bumps 30 may be arranged to extend substantially collinearly along a first axis, and the second bumps 31 may be arranged to extend substantially collinearly along a second axis that is offset from the first axis. The first bumps 30 and the second bumps 31 may respectively contact the first leads 20 and the second leads 21. The first bumps 30 and the second bumps 31 may serve as connection terminals that connect the semiconductor chip 60 to the first leads 20 and the second leads 21.

The under-fill layer 50 may be on and/or partially cover the substrate 10, the first leads 20, the second leads 21, and the solder masks 40. The under-fill layer 50 may be within and/or fill spaces between the bumps 30 and 31. The under-fill layer 50 may protect the first and second leads 20 and 21, the first and second bumps 30 and 31, and/or the semiconductor chip 60 from the external environment.

The semiconductor chip 60 may include an integrated circuit (IC). For example, the semiconductor chip 60 may be a display driver IC (DDI).

The first leads 20 and the second leads 21 may be disposed on opposite edges on a top surface of the substrate 10. Each of the first and second leads 20 and 21 may have a linear shape that extends along a first direction D1 parallel to the top surface of the substrate 10. Each of the first leads 20 may extend in the first direction D1 farther than each of the second leads 21. For example, the first lead 20 may have an end 20E that is spaced apart in the first direction D1 from an end 21E of the second lead 21.

The first leads 20 and the second leads 21 may be disposed spaced apart from each other and alternately with each other along a second direction D2 that is parallel to the top surface of the substrate 10 and is perpendicular to the first direction D1. The ends 20E of the first leads 20 and the ends 21E of the second leads 21 may be arranged in a zigzag fashion along the second direction D2. In some embodiments, the ends 20E of the first leads 20 may be arranged to extend substantially collinearly along a first axis in the second direction D2, and the ends 21E of the second leads 21 may be arranged to extend substantially collinearly along a second axis in the second direction D2 that is offset in the first direction D1 from the first axis.

The first and second leads 20 and 21 may include, for example, a conductive material, such as copper (Cu), gold (Au), silver (Ag), and/or iron (Fe).

In this description, the term "level" may indicate a height from the top surface of the substrate 10 along a third direction D3 perpendicular to the top surface of the substrate 10. The first lead 20 may have a bottom surface at substantially the same level as that of a bottom surface of the second lead 21. The bottom surfaces of the first and second leads 20 and 21 may be located at a level the same as or higher than that of the top surface of the substrate 10. The first lead 20 may have a width 202 in the second direction D2 substantially the same as a width 212 in the second direction D2 of the second lead 21.

The first lead 20 may include a first bump connector 20a, a first segment 20b, and a second segment 20c. The first bump connector 20a may correspond to the end 20E of the first lead 20. The second segment 20c of the first lead 20 may be spaced apart from the first bump connector 20a across the first segment 20b of the first lead 20. When viewed in plan, the first bump connector 20a may overlap (e.g., in the third direction D3) the semiconductor chip 60. The first segment 20b of the first lead 20 may have one end that overlaps (e.g., in the third direction D3) the semiconductor chip 60 and another end that overlaps (e.g., in the third direction D3) the solder mask 40. The second segment 20c of the first lead 20 may have one end that overlaps (e.g., in the third direction D3) the solder mask 40 and another end whose top surface is exposed by and/or does not overlap (e.g., in the third direction D3) the solder mask 40.

The first bump connector 20a of the first lead 20 may have a top surface 20at in contact with the first bump 30. The first bump 30 may have a width in the first direction D1 that is less than a width in the first direction D1 of the first bump connector 20a. The first bump 30 may have a width in the second direction D2 that is greater than a width in the second direction D2 of the first bump connector 20a. At least a portion of the top surface 20at of the first bump connector 20a may be exposed on opposite sides of the first bump 30. For example, in some embodiments, the top surface 20at of the first bump connector 20a may extend beyond opposite sides of the first bump 30 such that portions of the top surface 20at of the first bump connector 20a are not overlapped in the third direction D3 by the first bump 30.

The first segment 20b of the first lead 20 may have a thickness t2 less than a thickness t1 of the first bump connector 20a and less than a thickness t3 of the second segment 20c of the first lead 20. The thickness t1 of the first bump connector 20a may be substantially the same as the thickness t3 of the second segment 20c of the first lead 20.

The first segment 20b of the first lead 20 may have a top surface 20bt at a level lower than that of the top surface 20at of the first bump connector 20a and lower than a top surface 20ct of the second segment 20c of the first lead 20. The top surface 20at of the first bump connector 20a may be located at substantially the same level as that of the top surface 20ct of the second segment 20c of the first lead 20.

The second lead 21 may include a second bump connector 21a and a first segment 21b. The second bump connector 21a may correspond to the end 21E of the second lead 21. The first segment 21b of the second lead 21 may be connected to the second bump connector 21a. When viewed in plan, the second bump connector 21a may overlap (e.g., in the third direction D3) the semiconductor chip 60. The first segment 21b of the second lead 21 may have one end that overlaps (e.g., in the third direction D3) the semiconductor chip 60 and another end whose top surface is exposed by and/or does not overlap (e.g., in the third direction D3) the solder mask 40.

The second bump connector 21a may contact the second bump 31. The second bump 31 may have a width in the first direction D1 and a width in the second direction D2 that are substantially the same respectively as the width in the first direction D1 and the width in the second direction D2 of the first bump 30. The second bump connector 21a may have a width in the first direction D1 substantially the same as the width in the first direction D1 of the first bump connector 20a. The second bump connector 21a may have a top surface that is exposed on opposite sides of the second bump 31. For example, in some embodiments, the top surface of the second bump connector 21a may extend beyond opposite sides of the second bump 31 such that portions of the top surface of the second bump connector 21a are not overlapped in the third direction D3 by the second bump 31.

When viewed in plan, a distance ΔH1 in the second direction D2 between the second bump 31 and the first segment 20b of the first lead 20 may be less (e.g., shorter than) than a distance ΔH2 in the second direction D2 between the second bump connector 21a and the first segment 20b of the first lead 20. The second bump 31 may have a width ΔW1 in the first direction D1 less than a width ΔW2 in the first direction D1 of the first segment 20b of the first lead 20.

The second lead 21 may have a thickness ta that is uniform along the first direction D1. The thickness ta of the second lead 21 may be substantially the same as the thickness t1 of the first bump connector 20a and the thickness t3 of the second segment 20c of the first lead 20.

The thickness t2 of the first segment 20b of the first lead 20 may be less than the thickness ta of the second bump connector 21a. The thickness t2 of the first segment 20b of the first lead 20 may range, for example, from 2 μm to less than 8 μm. The thickness ta of the second bump connector 21a may range, for example, from 8 μm to 10 μm.

In some embodiments, there may be a difference of 2 μm or more in level between the top surface 21at of the second bump connector 21a of the second lead 21 and the top surface 20bt of the first segment 20b of the first lead 20.

A dielectric pattern 70 may be provided on the first segment 20b of the first lead 20. The dielectric pattern 70 may be on and/or cover the top surface 20bt of the first segment 20b of the first lead 20 and also be on and/or cover opposite lateral surfaces in the second direction D2 of the first segment 20b of the first lead 20. The dielectric pattern 70 may include an organic solderability preservative (OSP).

The dielectric pattern 70 may have a top surface 70t at a lower level than that of the top surface 21at of the second bump connector 21a.

Figure 2A:
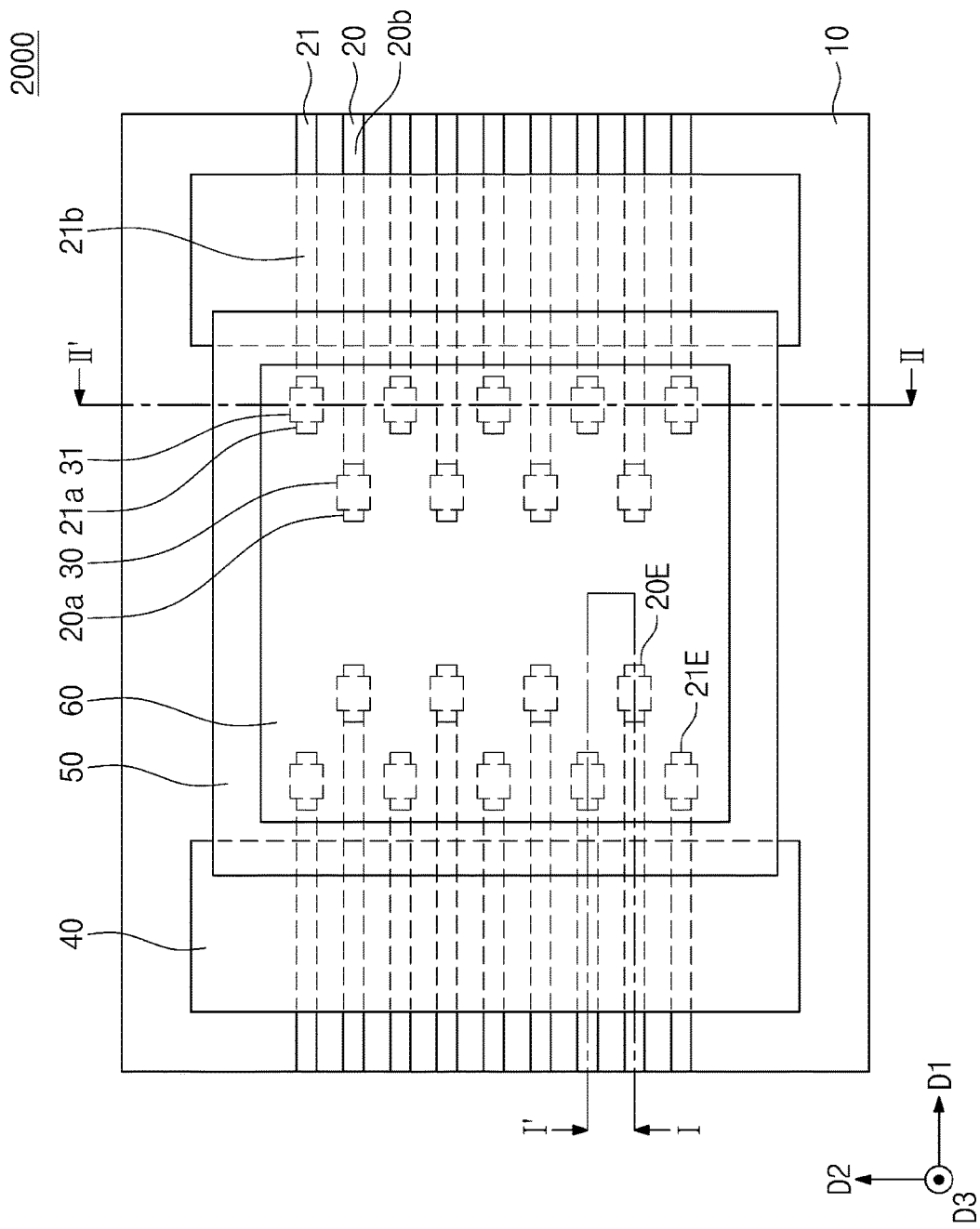
FIG. 2A illustrates a plan view of a semiconductor device according to some example embodiments of the present inventive concepts.
Figure 2B:
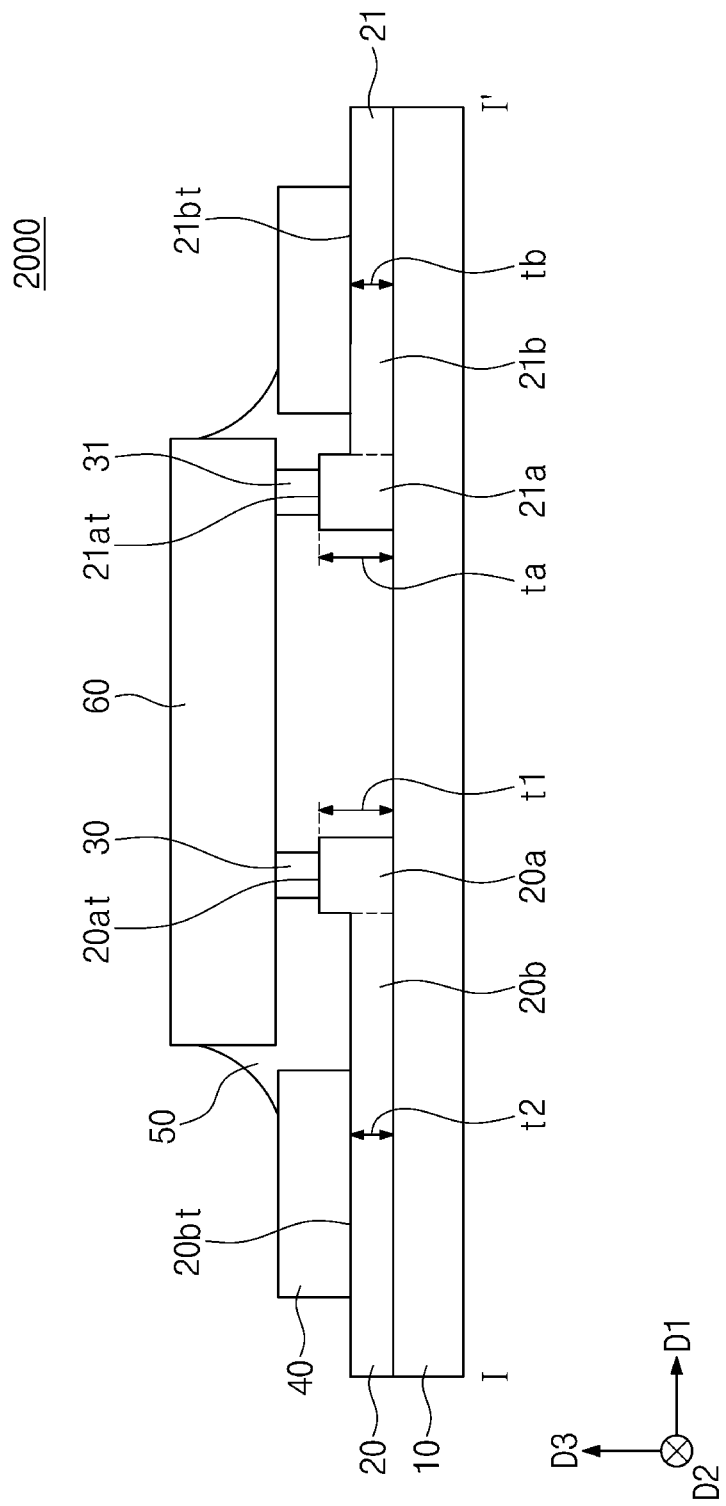
FIG. 2B illustrates a cross-sectional view taken along line I-I' of FIG. 2A.
Figure 2C:
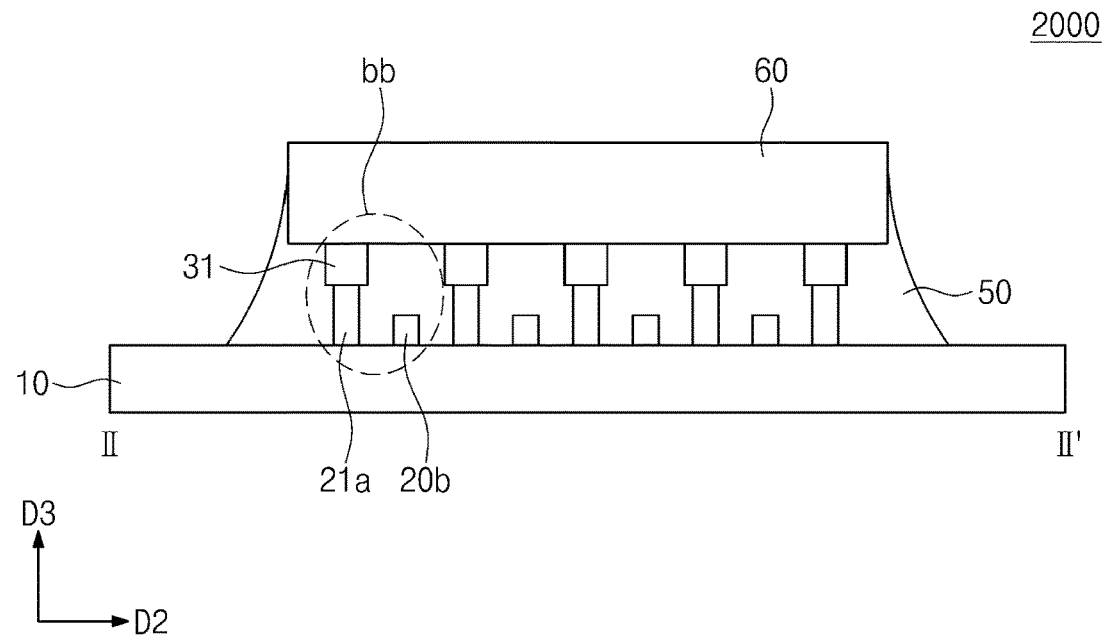
FIG. 2C illustrates a cross-sectional view taken along line II-II' of FIG. 2A.
Figure 2D:
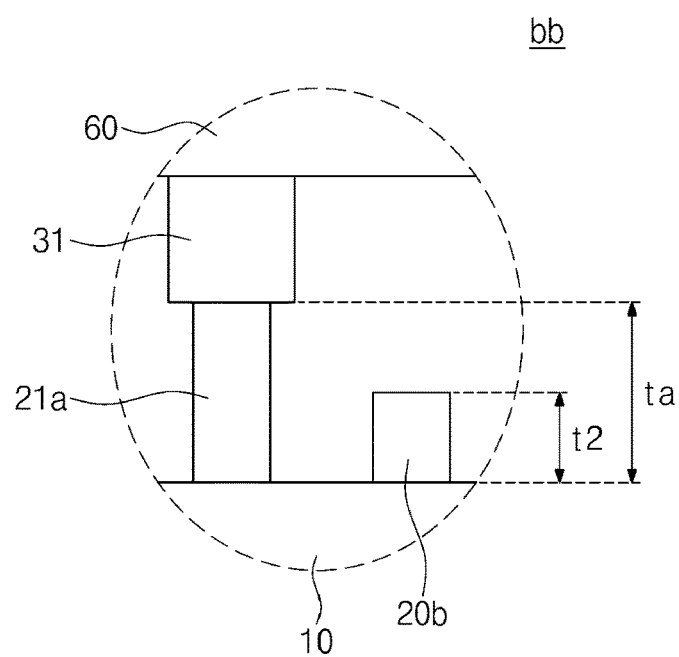
FIG. 2D illustrates an enlarged view showing section 'bb' of FIG. 2C.

FIG. 2A illustrates a plan view of a semiconductor device according to some example embodiments of the present inventive concepts. FIG. 2B illustrates a cross-sectional view taken along line I-I' of FIG. 2A. FIG. 2C illustrates a cross-sectional view taken along line II-II' of FIG. 2A. FIG. 2D illustrates an enlarged view showing section 'bb' of FIG. 2C. Except as discussed below, the present inventive concepts have been described in detail with reference to FIGS. 1A to 1D, and thus further explanations will be omitted.

Referring to FIGS. 2A to 2D, a first lead 20 of a semiconductor device 2000 may include a first bump connector 20a and a first segment 20b. The first bump connector 20a may correspond to an end 20E of the first lead 20. The first segment 20b of the first lead 20 may correspond to a remaining portion other than the first bump connector 20a. When viewed in plan, the first segment 20b of the first lead 20 may have one end that overlaps (e.g., in the third direction D3) a semiconductor chip 60 and another end whose top surface is exposed by a solder mask 40 (e.g., is not overlapped in the third direction D3 by a solder mask 40).

The first segment 20b of the first lead 20 may have a thickness t2 less than a thickness t1 of the first bump connector 20a. The first segment 20b of the first lead 20 may have a top surface 20bt at a lower level than that of a top surface 20at of the first bump connector 20a.

A second lead 21 may include a second bump connector 21a and a first segment 21b. The second bump connector 21a may correspond to an end 21E of the second lead 21. The first segment 21b of the second lead 21 may correspond to a remaining portion other than the second bump connector 21a of the second lead 21. The first segment 21b of the second lead 21 may have one end that overlaps (e.g., in the third direction D3) the semiconductor chip 60 and another end whose top surface is exposed by the solder mask 40 (e.g., is not overlapped in the third direction D3 by the solder mask 40).

The first segment 21b of the second lead 21 may have a thickness tb that is less than a thickness ta of the second bump connector 21a. The first segment 21b of the second lead 21 may have a top surface 21bt at a lower level than that of a top surface 21at of the second bump connector 21a.

The top surface 21bt of the first segment 21b of the second lead 21 may be located at substantially the same level as that of the top surface 20bt of the first segment 20b of the first lead 20.

The thickness t2 of the first segment 20b of the first lead 20 may be less than the thickness ta of the second bump connector 21a. The thickness t2 of the first segment 20b of the first lead 20 may range, for example, from 2 μm to 10 μm. For example, the thickness t2 of the first segment 20b of the first lead 20 may range from 8 μm to 10 μm.

The thickness ta of the second bump connector 21a may range, for example, from 10 μm to 16 μm. In some embodiments, there may be a difference of 2 μm to 8 μm between the thickness t2 of the first segment 20b of the first lead 20 and the thickness ta of the second bump connector 21a of the second lead 21.

In some embodiments, there may be a difference of 2 μm or more (e.g., from 2 μm to 8 μm, from 2 μm to 10 μm) in level between the top surface 20at of the first bump connector 20a (or the top surface 21at of the second bump connector 21a) and the top surface 20bt of the first segment 20b of the first lead 20 (or the top surface 21bt of the first segment 21b of the second lead 21).

Figure 3A:
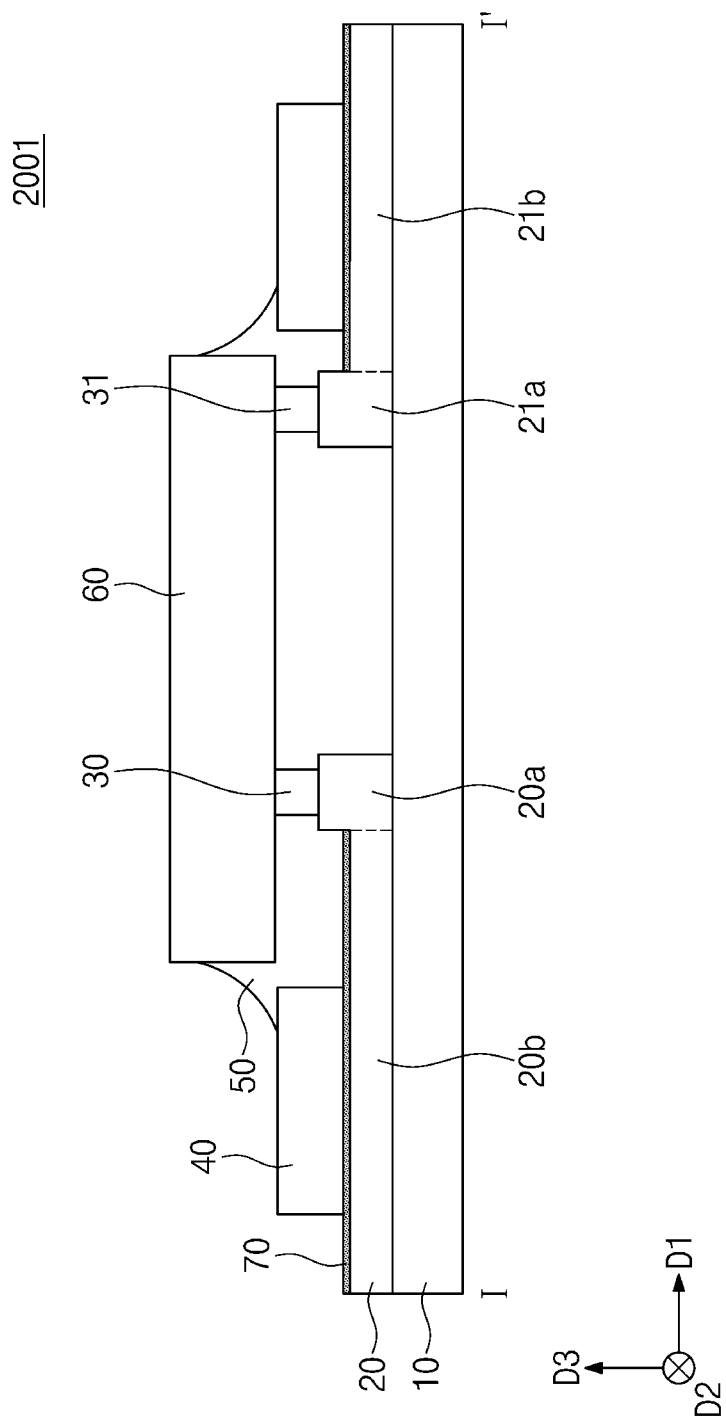

FIGS. 3A and 3B illustrate cross-sectional views, respectively taken along lines I-I' and II-II' of FIG. 2A, of a semiconductor device according to some example embodiments of the present inventive concepts.

Referring to FIGS. 3A and 3B, a semiconductor device 2001 may include a dielectric pattern 70 that is provided on the first segment 20b of the first lead 20 and also on the first segment 21b of the second lead 21. The dielectric pattern 70 may be on and/or cover the top surface of the first segment 20b of the first lead 20 and also be on and/or cover opposite lateral surfaces in the second direction D2 of the first segment 20b of the first lead 20. The dielectric pattern 70 may be on and/or cover the top surface of the first segment 21b of the second lead 21 and also be on and/or cover opposite lateral surfaces in the second direction D2 of the first segment 21b of the second lead 21. The dielectric pattern 70 may have a top surface 70t at a lower level than that of the top surface 21at of the second bump connector 21a.

FIGS. 4A to 4D illustrate cross-sectional views taken along line I-I' of FIG. 1A, showing a method of fabricating a semiconductor device according to some example embodiments of the present inventive concepts.

Figure 4A:
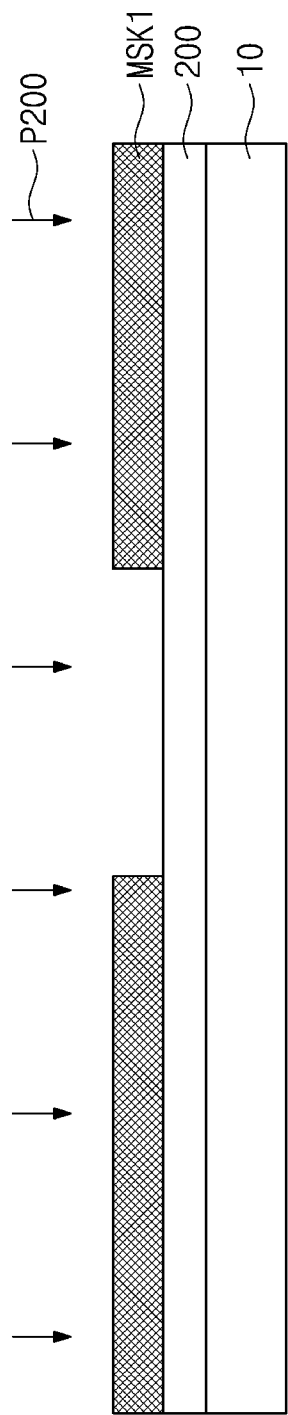

Referring to FIG. 4A, a metal layer 200 may be formed on a substrate 10. The metal layer 200 may be attached through an adhesive layer (not shown) to the substrate 10. A first mask pattern MSK1 having a plurality of openings (one of which is illustrated in FIG. 4A) may be formed on the metal layer 200. The metal layer 200 may be patterned by a first etching process P200 that uses the first mask pattern MSK1.

Figure 4B:
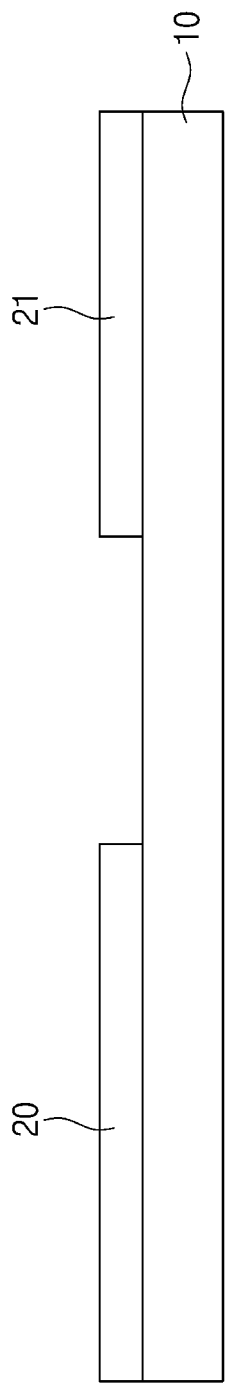

Referring to FIG. 4B, the metal layer 200 may be patterned to form a plurality of first leads 20 and a plurality of second leads 21. Afterwards, the first mask pattern MSK1 may be removed.

Referring to FIG. 4C, a second mask pattern MSK2 may be formed which exposes top surfaces of the first leads 20. The second mask pattern MSK2 may protect (e.g., not expose) the second leads 21. A second etching process P201 may be performed to partially etch the first lead 20.

Referring to FIG. 4D, the first lead 20 may be partially etched to form a first segment 20b of the first lead 20. The first segment 20b of the first lead 20 may have a thickness t2 less than a thickness to of the second lead 21 adjacent thereto. A coating process may be performed to form a dielectric pattern 70 on the first segments 20b of the first leads 20. The second mask pattern MSK2 may be removed.

Referring back to FIGS. 1B and 1C, a plurality of solder masks 40 may be formed on portions of the first and second leads 20 and 21. A semiconductor chip 60 may be mounted on the substrate 10. While the semiconductor chip 60 is mounted on the substrate 10, a first bump 30 may be aligned with and thermally compressed on a first bump connector 20a of the first lead 20, and a second bump 31 may be aligned with and thermally compressed on a second bump connector 21a of the second lead 21. An under-fill layer 50 may be formed to fill spaces between the bumps 30 and 31.

FIGS. 5A to 5D illustrate cross-sectional views showing a method of fabricating a semiconductor device according to some example embodiments of the present inventive concepts.

Referring to FIG. 5A, a metal seed layer 201 may be formed on a substrate 10. The metal seed layer 201 may include, for example, copper. A first mask pattern MSK1 may be formed on the metal seed layer 201.

Referring to FIG. 5B, a first lead 20 and a second lead 21 may be formed on the metal seed layer 201 that is exposed from the first mask pattern MSK1. For example, an electroplating process may be employed to deposit the first lead 20 and the second lead 21.

Figure 5C:
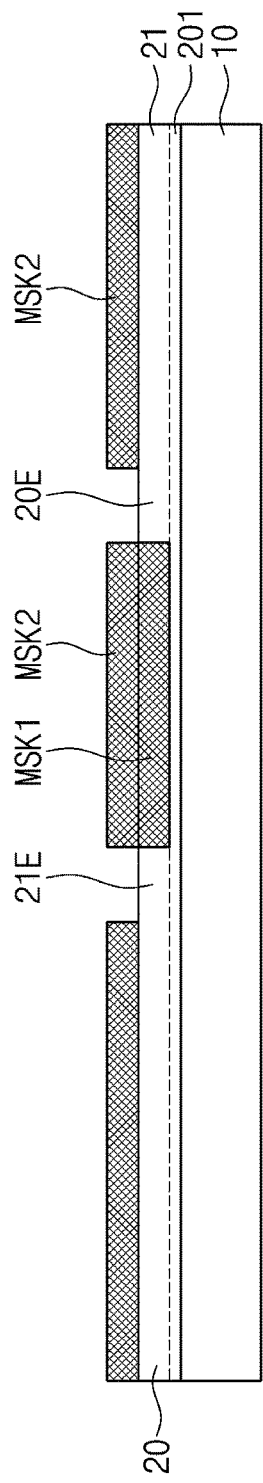

Referring to FIG. 5C, a second mask pattern MSK2 may be formed on the first mask pattern MSK1. The second mask pattern MSK2 may have openings that selectively expose an end 21E of the second lead 21 and an end 20E of the first lead 20.

Figure 5D:
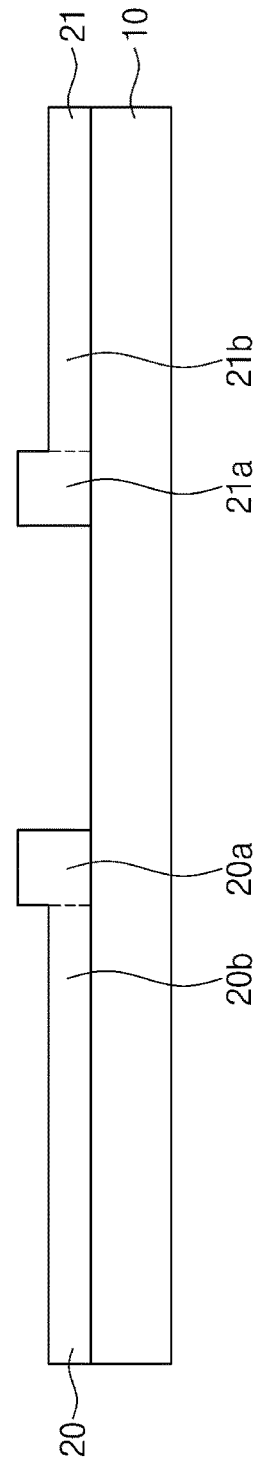

Referring to FIG. 5D, a conductive material (e.g., copper) may be deposited locally on the end 20E of the first lead 20 and the end 21E of the second lead 21, thereby forming a first bump connector 20a and a second bump connector 21a. The second mask pattern MSK2 may be removed, and then the metal seed layer 201, which is not formed into the first and second leads 20 and 21 (e.g., a portion of the metal seed layer 201 between the first and second leads 20 and 21 and the substrate 10), may be removed from the substrate 10.

Referring back to FIG. 2B, a plurality of solder masks 40 may be formed, a semiconductor chip 60 may be mounted on the substrate 10, and then an under-fill layer 50 may be formed.

In a semiconductor device that is mounted in a flip-chip manner and has staggered bumps and their corresponding leads, even when a slight alignment is established between the bump and the lead, a leakage current may flow through an adjacent lead. According to the present inventive concepts, a step difference between the bump and its adjacent lead may be controlled to prevent and/or reduce the current leakage and to provide a fine-pitch structure.

Moreover, neighboring leads may be provided therebetween with a structure that prevents and/or reduces the current leakage, and thus an increased number of the leads may be formed in a restricted area.

Although the present invention has been described in connection with the some example embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not limiting.

What is claimed is:
1. A semiconductor device, comprising:
a substrate; and
a first lead, a second lead, a third lead and a semiconductor chip on the substrate,
wherein each of the first lead, the second lead, and the third lead comprise an extending part on the substrate to below the semiconductor chip along a first direction parallel to a top surface of the substrate,
wherein the extending part of the first lead comprises a first bump connector and a first segment directly connected to the first bump connector,
wherein the extending part of the second lead comprises a second bump connector,
wherein the extending part of the third lead comprises a third bump connector,
wherein the first bump connector is spaced apart from each of the second bump connector and the third bump connector in the first direction and a second direction, the second direction being parallel to the top surface of the substrate and perpendicular to the first direction,
wherein the second bump connector is spaced apart from the third bump connector in the second direction with the first segment of the first lead interposed therebetween,
wherein the first segment of the first lead has a linear shape extending in the first direction, and wherein a thickness of the first segment of the first lead is less than a thickness of the second bump connector and a thickness of the third bump connector.

2. The semiconductor device of claim 1, wherein the thickness of the first segment of the first lead is less than a thickness of the first bump connector.

3. The semiconductor device of claim 1, wherein a bottom surface of the first lead is at a same level as a bottom surface of the second lead, and
wherein a top surface of the first segment of the first lead is at a level lower than a level of a top surface of the second bump connector of the second lead.

4. The semiconductor device of claim 1, wherein a bottom surface of each of the first and the second leads is at a level that is the same as or higher than a level of the top surface of the substrate.

5. The semiconductor device of claim 1, wherein the first lead further comprises a second segment,
wherein the first segment of the first lead is between the second segment of the first lead and the first bump connector, and
wherein a top surface of the first bump connector and a top surface the second segment of the first lead are at a level higher than a level of a top surface of the first segment of the first lead.

6. The semiconductor device of claim 5, further comprising a bump on the second bump connector,
wherein a width in the first direction of the bump is less than a width in the first direction of the first segment of the first lead.

7. The semiconductor device of claim 5, further comprising a dielectric pattern on the top surface of the first segment of the first lead and on opposite lateral surfaces in the second direction of the first segment of the first lead.

8. The semiconductor device of claim 7, wherein the dielectric pattern comprises an organic solderability preservative (OSP).

9. The semiconductor device of claim 1, wherein the substrate comprises a printed circuit substrate (PCB) or a flexible film comprising polyimide.

10. The semiconductor device of claim 1, wherein a thickness of the second lead is uniform along the first direction.

11. The semiconductor device of claim 1, wherein the first segment of the first lead extends from an edge of the substrate to below the semiconductor chip, and
wherein the thickness of the first segment of the first lead is uniform along the first direction.

12. The semiconductor device of claim 11, wherein the second lead further comprises a first segment connected to the second bump connector,
wherein the second bump connector is at an end of the second lead, and
wherein a thickness of the first segment of the second lead is less than the thickness of the second bump connector.

13. The semiconductor device of claim 11, further comprising a dielectric pattern on the first segment of the first lead and on the first segment of the second lead.

14. A semiconductor device, comprising:
a substrate;
a semiconductor chip on the substrate;
a plurality of first leads between the semiconductor chip and the substrate; and
a plurality of second leads between ones of the plurality of first leads,
wherein the first leads and the second leads extend on the substrate to below the semiconductor chip along a first direction parallel to a top surface of the substrate,
wherein the first leads extend in the first direction farther than the second leads,
wherein each of the first leads comprises a first bump connector and each of the second leads comprises a second bump connector,
wherein the first bump connectors and the second bump connectors are arranged in a zigzag fashion along a second direction that is parallel to the top surface of the substrate and is perpendicular to the first direction,
wherein each of the first leads comprises a first segment between adjacent second bump connectors, and
wherein a top surface of the first segment of each of the first leads is at a level lower than a level of a top surface of each of the second bump connectors,
further comprising a dielectric pattern that is on the first segment of each of the first leads,
wherein a top surface of the dielectric pattern is at a level lower than the level of the top surface of the second bump connector of each of the second leads.

15. The semiconductor device of claim 14, wherein each of the first leads further comprises a second segment that is spaced apart from the first bump connector by the first segment,
wherein a thickness of the first bump connector and a thickness of the second segment of each of the first leads are greater than a thickness of the first segment of each of the first leads,
wherein each of the second leads comprise uniform thicknesses along the first direction,
wherein a difference in thickness between the second bump connector of each of the second leads and the first segment of each of the first leads is in a range from 2 µm to 8 µm, and
wherein the thickness of the first segment of each of the first leads is in a range from 2 µm to 8 µm.

16. The semiconductor device of claim 14, wherein each of the second leads further comprises a first segment connected to the second bump connector,
wherein a thickness of the second bump connector of each of the second leads is greater than a thickness of the first segment of each of the second leads,
wherein a difference in thickness between the second bump connector of each of the second leads and the first segment of each of the first leads is in a range from 2 µm to 8 µm, and
wherein the thickness of the first segment of each of the first leads is in a range from 8 µm to 10 µm.

17. The semiconductor device of claim 14, further comprising:
a first bump on the first bump connector of each of the first leads; and
a second bump on the second bump connector of each of the second leads,
wherein a top surface of the first bump connector i-s-extends beyond opposite sides of the first bump, and
wherein the top surface of the second bump connector extends beyond opposite sides of the second bump.

18. A semiconductor device, comprising:
a substrate;
a semiconductor chip on the substrate;
a first lead and a second lead between the substrate and the semiconductor chip;
a solder mask that is on portions of the first lead and the second lead; and an under-fill layer on portions of the substrate, the first lead, the second lead, and the solder mask, wherein the first lead and the second lead extend on the substrate to below the semiconductor chip along a first direction parallel to a top surface of the substrate, wherein the first lead extends in the first direction farther than the second lead, wherein the first lead and the second lead are spaced apart from each other in a second direction that is parallel to the top surface of the substrate and is perpendicular to the first direction, wherein the first lead comprises a first bump connector, a first segment, and a second segment, the first segment being between the second segment and the first bump connector, wherein the second lead comprises a second bump connector, wherein a dielectric pattern is on the first segment of the first lead, wherein the first bump connector is spaced apart in the second direction from the second bump connector, wherein the first segment of the first lead is spaced apart in the second direction from the second bump connector, wherein a first end of the first segment of the first lead vertically overlaps the semiconductor chip, and a second end of the first segment of the first lead vertically overlaps the solder mask, and wherein a thickness of the first segment of the first lead is less than a thickness of the second bump connector, a thickness of the first bump connector, and a thickness of the second segment of the first lead.

19. The semiconductor device of claim 18, wherein a difference in thickness between the second bump connector and the first segment of the first lead is in a range of from 2 μm to 8 μm, wherein the substrate comprises polyimide, wherein the first lead and the second lead comprise copper, and wherein the dielectric pattern comprises an organic solderability preservative (OSP).

* * * * *